(12) United States Patent  (10) Patent No.: US 8,019,396 B2
Wayman  (45) Date of Patent: Sep. 13, 2011

(54) PULL-OUT SHELF FOR USE IN A CONFINED SPACE FORMED IN A STRUCTURE

(75) Inventor: Michael J. Wayman, Waconia, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 500 days.

(21) Appl. No.: 12/199,879

(22) Filed: Aug. 28, 2008

(65) Prior Publication Data

US 2009/0309469 A1 Dec. 17, 2009

Related U.S. Application Data

(60) Provisional application No. 61/060,740, filed on Jun. 11, 2008.

(51) Int. Cl.
*H04W 88/02* (2009.01)
(52) U.S. Cl. ..................................... 455/575.3; 455/560
(58) Field of Classification Search .................. 455/560, 455/575.1, 575.2, 575.3, 575.4; 370/329; 312/205
See application file for complete search history.

(56) References Cited

U.S. PATENT DOCUMENTS

| | | | |
|---|---|---|---|
| 4,371,757 A | 2/1983 | Debortoli et al. | |
| 4,549,602 A | 10/1985 | Espinoza | |
| 5,267,762 A | 12/1993 | Gromotka | |
| 6,065,612 A | 5/2000 | Rinderer | |
| 6,082,441 A | 7/2000 | Boehmer et al. | |
| 6,142,595 A | 11/2000 | Dellapi et al. | |
| 6,238,027 B1 | 5/2001 | Kohler et al. | |
| 6,579,029 B1 | 6/2003 | Sevde et al. | |
| 6,968,647 B2 | 11/2005 | Levesque et al. | |
| 7,225,586 B2 | 6/2007 | Levesque et al. | |
| 2007/0247809 A1 | 10/2007 | McClure | |
| 2010/0290620 A1* | 11/2010 | Quan | 380/203 |
| 2011/0012775 A1* | 1/2011 | Richards et al. | 342/146 |

* cited by examiner

*Primary Examiner* — Diane Mizrahi
(74) *Attorney, Agent, or Firm* — Fogg & Powers LLC

(57) ABSTRACT

A shelf assembly for a confined space formed within a structure is provided. The shelf assembly includes a fixed portion having a structure attachment interface to fixedly attach the shelf assembly to the structure and a slideable portion that is operable to slide out and extend from the fixed portion of the shelf assembly. The slideable portion has an enclosure attachment interface to attach an electronics enclosure to the slideable portion of the shelf assembly. The slideable portion has a first state and a second state in which the slideable portion is held in a first position or second position, respectively. In the first state, the entire slideable portion of the shelf assembly is positioned within the structure. In the second state, at least the enclosure attachment interface is positioned outside of the structure.

12 Claims, 15 Drawing Sheets

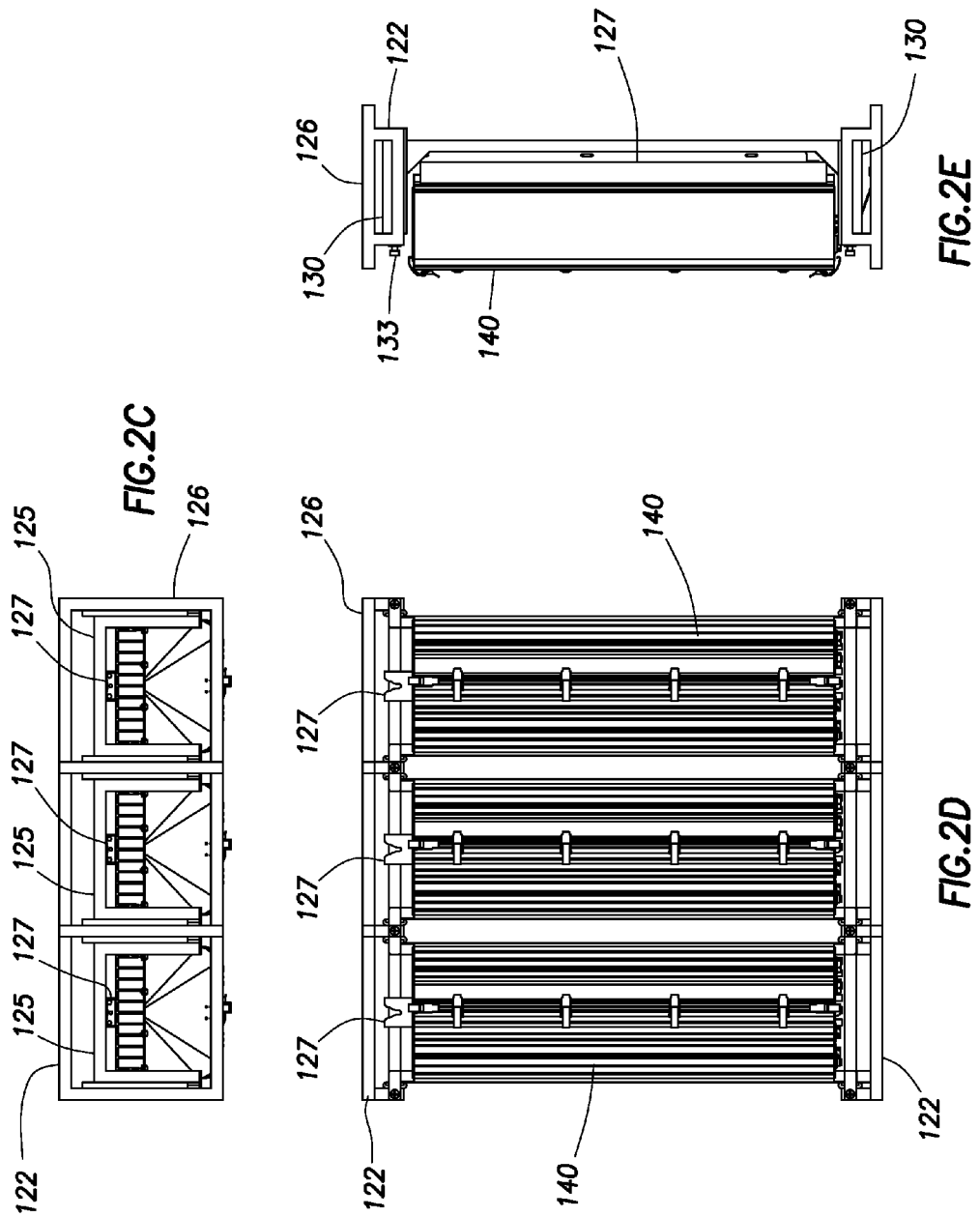

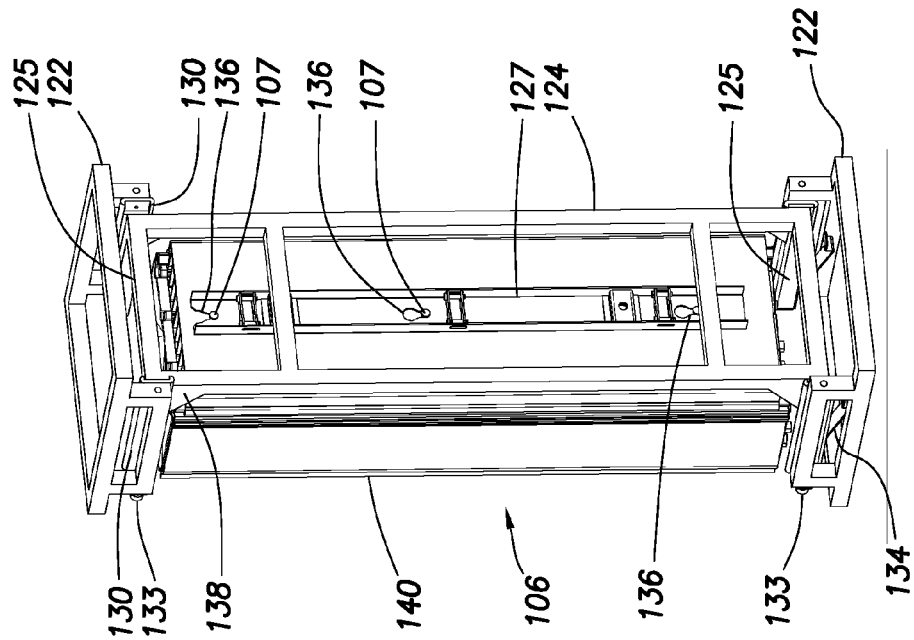
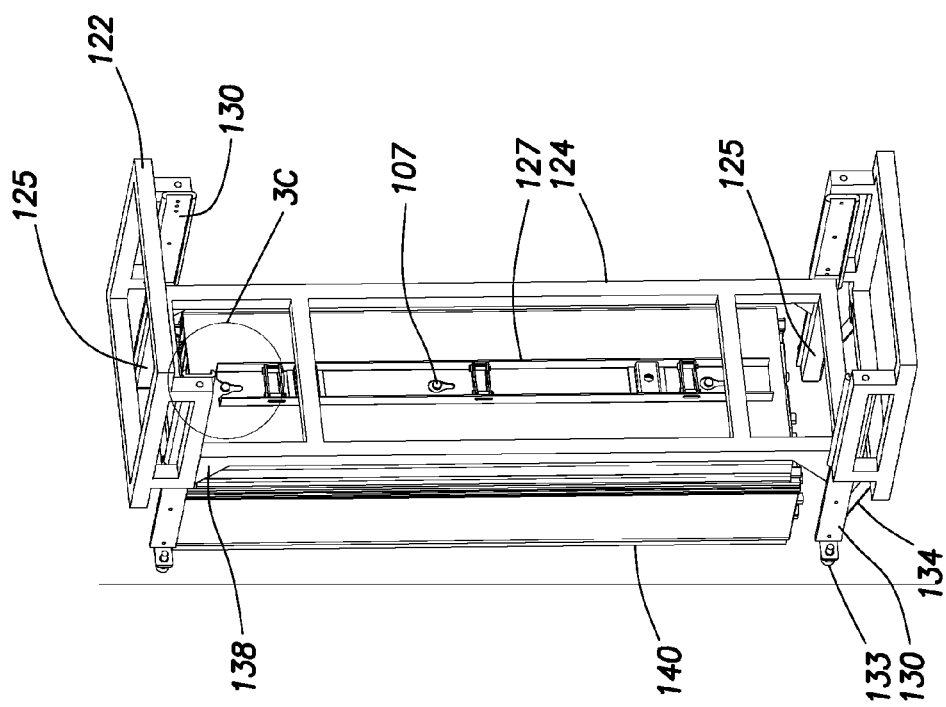

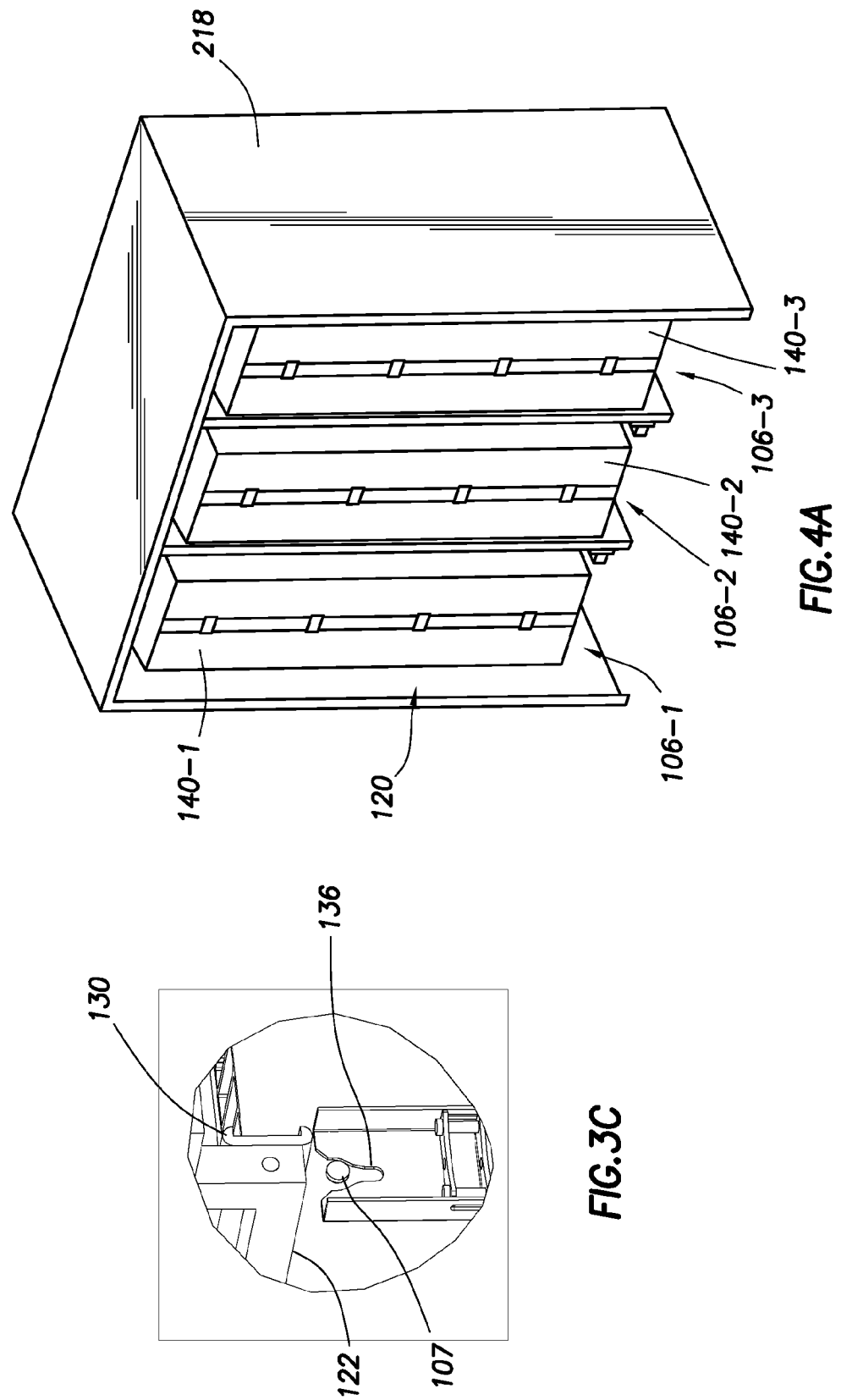

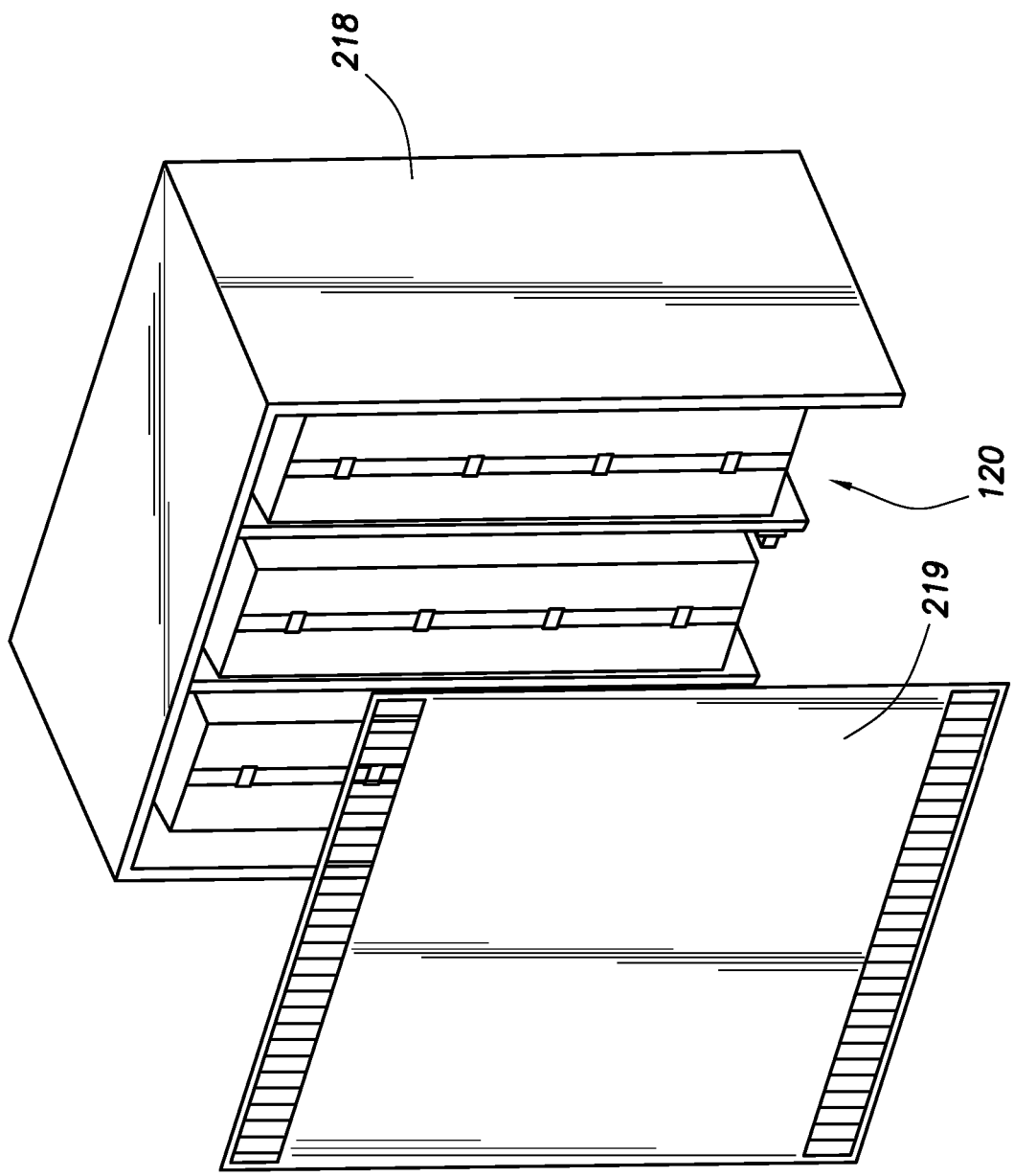

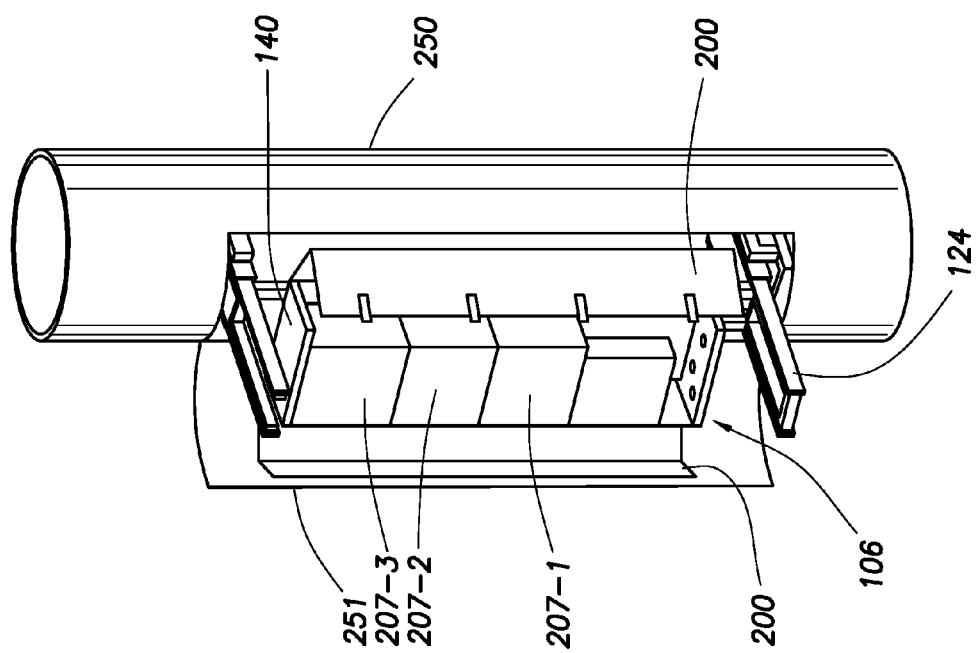
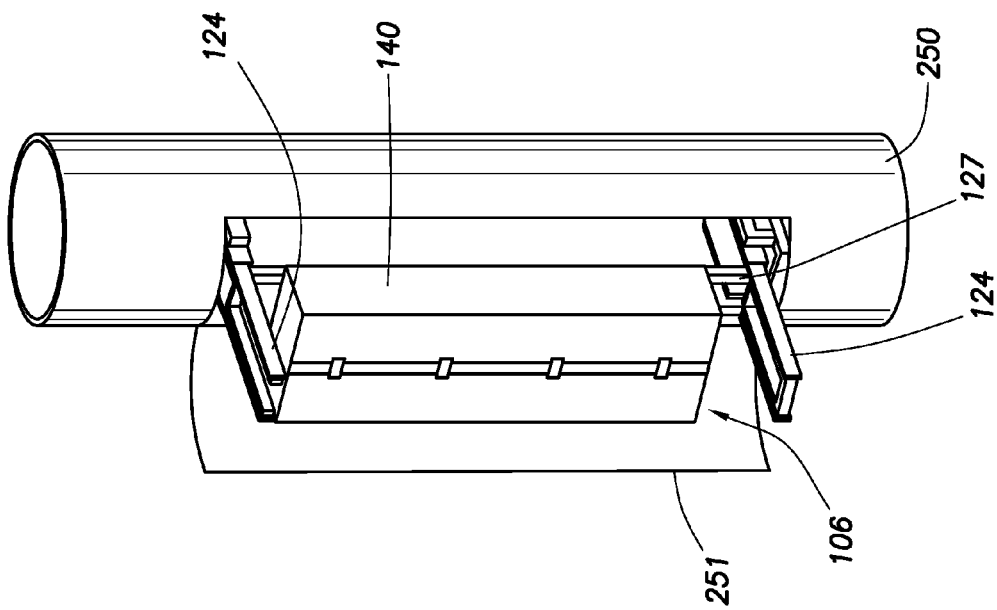

PULL-OUT SHELF FOR USE IN A CONFINED SPACE FORMED IN A STRUCTURE

CROSS-REFERENCE TO RELATED APPLICATIONS

This application claims the benefit of U.S. Provisional Application No. 61/060,740, filed on Jun. 11, 2008, which is incorporated herein by reference in its entirety.

This application is related to the following co-pending United States patent applications filed on even date with U.S. Provisional Application No. 61/060,740, all of which are hereby incorporated herein by reference:

U.S. patent application Ser. No. 12/137,322, titled "COMMUNICATION MODULES" and which is referred to here as the '322 Application;

U.S. patent application Ser. No. 12/137,297, titled "APPARATUS FOR MOUNTING A MODULE AND ENABLING HEAT CONDUCTION FROM THE MODULE TO THE MOUNTING SURFACE" and which is referred to here as the '297 Application;

U.S. patent application Ser. No. 61/060,589, titled "SUSPENSION METHOD FOR COMPLIANT THERMAL CONTACT OF ELECTRONIC MODULES" and which is referred to here as the '589 Application;

U.S. patent application Ser. No. 12/137,307, titled "ANGLED DOORS WITH CONTINUOUS SEAL" and which is referred to here as the '307 Application;

U.S. patent application Ser. No. 61/060,523, titled "L-SHAPED DOOR WITH 3-SURFACE SEAL FOR ENDPLATES" and which is referred to here as the '523 Application;

U.S. patent application Ser. No. 61/060,576, titled "L-SHAPED DOORS WITH TRAPEZOIDAL SEAL" and which is referred to here as the '576 Application;

U.S. patent application Ser. No. 12/137,309, titled "SYSTEMS AND METHODS FOR VENTURI FAN-ASSISTED COOLING" and which is referred to here as the '309 Application;

U.S. patent application Ser. No. 61/060,547, titled "COMBINATION EXTRUDED AND CAST METAL OUTDOOR ELECTRONICS ENCLOSURE" and which is referred to here as the '547 Application;

U.S. patent application Ser. No. 61/060,584, titled "SYSTEMS AND METHODS FOR CABLE MANAGEMENT" and which is referred to here as the '584 Application;

U.S. patent application Ser. No. 61/060,581, titled "CAM SHAPED HINGES" and which is referred to here as the '581 Application;

U.S. patent application Ser. No. 12/137,313, titled "SOLAR SHIELDS" and which is referred to here as the '313 Application;

U.S. patent application Ser. No. 61/060,501, titled "APPARATUS AND METHOD FOR BLIND SLOTS FOR SELF DRILLING/SELF-TAPPING SCREWS" and which is referred to here as the '501 Application;

U.S. patent application Ser. No. 61/060,593, titled "SYSTEMS AND METHODS FOR THERMAL MANAGEMENT" and which is referred to here as the '593 Application; and U.S. patent application Ser. No. 61/060,762, titled "SERF BOARD COMPONENTS" and which is referred to here as the '762 Application.

BACKGROUND

One common wireless communication system configuration employs equipment located at a centralized location (for example, at a facility that is controlled by a wireless service provider) and equipment that is located at a location that is remote from the centralized location (for example, at a facility or site that is not controlled by the wireless service provider). The former equipment is also referred to here as a "hub unit" or "host unit" and the latter equipment is also referred to here as a "remote unit."

One example of such a system is a distributed antenna system (DAS) in which radio frequency (RF) signals are communicated between a host unit and one or more remote antenna units (RAUs). In such a DAS, the host unit is communicatively coupled to one or more base stations (for example, via wired connection or via wireless connection). Downlink RF signals are received from the base station at the host unit. The host unit uses the downlink RF signals to generate a downlink transport signal for transmitting to one or more of the RAUs. Each such RAU receives the downlink transport signal and reconstructs the downlink RF signals from the downlink transport signal and causes the reconstructed downlink RF signals to be radiated from at least one antenna coupled to or included in that RAU. A similar process is performed in the uplink direction. Uplink RF signals received at one or more RAUs are used to generate respective uplink transport signals that are transmitted from the respective RAUs to the host unit. The host unit receives and combines the uplink transport signals transmitted from the RAUs. The host unit reconstructs the uplink RF signals received at the RAUs and communicates the reconstructed uplink RF signals to the base station. In this way, the coverage of the base station can be expanded using the DAS.

In some DAS deployments, the remote antennas are installed on a utility pole or other urban street furniture such as bus shelters, traffic control signals, mail boxes or other structures. In some such deployments, the RAU for each pole-mounted remote antenna must be housed entirely within the utility pole, for example, for zoning reasons or for security reasons. However, it can be difficult to mount an RAU to the interior of such a confined space. Also, it can be difficult to service an RAU that is located within such a confined space.

SUMMARY

One aspect of the present application relates to a shelf assembly for a confined space formed within a structure. The shelf assembly includes a fixed portion having a structure attachment interface to fixedly attach the shelf assembly to the structure and a slideable portion that is operable to slide out and extend from the fixed portion of the shelf assembly. The slideable portion has an enclosure attachment interface to attach an electronics enclosure to the slideable portion of the shelf assembly. The slideable portion is configured to have a first state in which the slideable portion is held in a first position. The slideable portion is configured to have the entire slideable portion of the shelf assembly positioned within the structure when the slideable portion is in the first state. The slideable portion is configured to have a second state in which the slideable portion is held in a second position. The slideable portion is configured to have at least the enclosure attachment interface positioned outside of the structure when the slideable portion is in the second state.

Another aspect of the present application relates to a method of mounting an electronics enclosure within a confined space formed within a structure. The method includes attaching a fixed portion of a shelf assembly to a point within the confined space of the structure. The shelf assembly includes the fixed portion and a slideable portion. The slideable portion has an enclosure attachment interface. The method also includes sliding the slideable portion of the shelf assembly so that the enclosure attachment interface is positioned outside of the confined space, attaching an electronics enclosure to the enclosure attachment interface, and sliding the slideable portion of the shelf assembly so that the slideable portion and the electronics enclosure are positioned entirely within the confined space.

Another aspect of the present application relates to a wireless communication system including a first unit located at a first location and at least one remote unit communicatively coupled to the first unit. The at least one remote unit is located at a second location that is remote from the first location. The wireless communication system includes a shelf assembly to mount the remote unit within a confined space formed within a structure at the second location. The shelf assembly includes a fixed portion that has a structure attachment interface to fixedly attach the shelf assembly to the structure, and a slideable portion that is operable to slide out and extend from the fixed portion of the shelf assembly. The slideable portion has a remote unit attachment interface to attach the remote unit to the slideable portion of the shelf assembly. The slideable portion is configured to have a first state in which the slideable portion is held in a first position. The slideable portion is configured to have the entire slideable portion of the shelf assembly positioned within the structure when the slideable portion is in the first state. The slideable portion is configured to have a second state in which the slideable portion is held in a second position. The slideable portion is configured to have at least the remote unit attachment interface positioned outside of the structure when the slideable portion is in the second state.

Yet another aspect of the present application relates to a shelf assembly for a confined space, the confined space formed within a structure. The shelf assembly includes a fixed means for fixedly attaching the shelf assembly to the structure, and a slideable means for sliding an enclosure attaching means. The enclosure attaching means attach an electronics enclosure to the shelf assembly. The slideable means comprises means for holding the enclosure attaching means in a first position in which all of the slideable means of the shelf assembly is positioned within the structure, and the slideable means comprises means for holding the enclosure attaching means in a second position in which at least the enclosure attachment means is positioned outside of the structure.

DRAWINGS

FIGS. 2A-2E are diagrams showing one embodiment of a shelf assembly suitable for use in the system of FIG. 1B.

FIGS. 3A-3E are diagrams showing an alternative embodiment of a shelf assembly suitable for use in the system 100 of FIG. 1A.

FIGS. 4A-4E are diagrams showing one embodiment of a shelf assembly in an enclosure of FIG. 1B.

FIGS. 5A-5D are diagrams showing one embodiment of a shelf assembly in an enclosure of FIG. 1A.

Like reference numbers and designations in the various drawings indicate like elements.

DETAILED DESCRIPTION

Figure 1A:
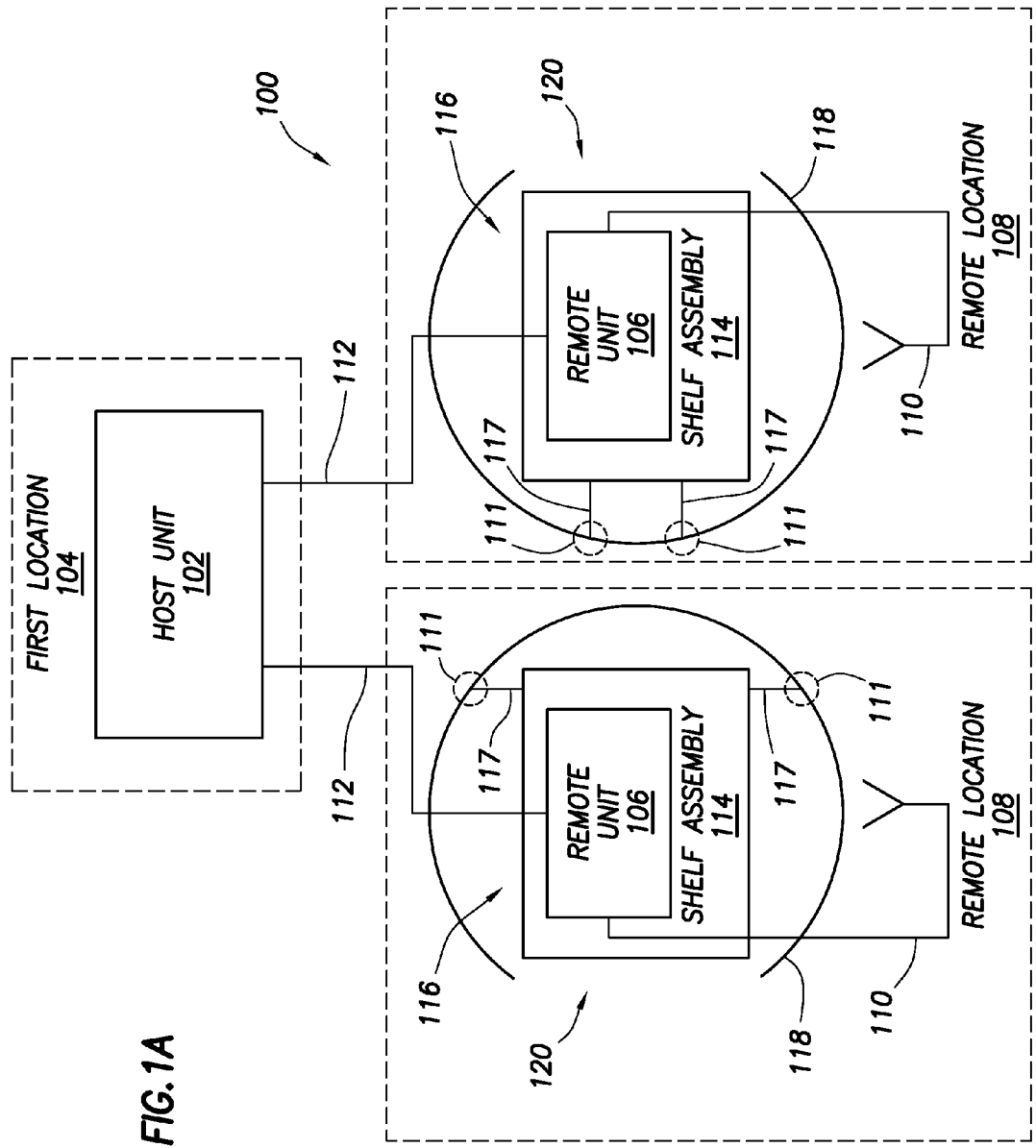
FIG. 1A is a block diagram of one embodiment of a wireless communication system.

FIG. 1A is a block diagram of one embodiment of a wireless communication system 100. The wireless communication system 100 includes a first unit 102 located at a first location 104. The first unit 102 is also referred to here as "centralized unit 102" or "host unit 102" or "hub unit 102." The wireless communication system 100 also includes at least one remote unit 106. In the particular exemplary embodiment shown in FIG. 1A, only two remote units 106 are shown for ease of explanation, though it is to be understood that a different number of remote units 106 are used in other embodiments. Each of the remote units 106 is located at a respective remote location 108 that is remote from the first location 104. In some embodiments, more than one remote unit 106 may be co-located at the same location (for example, where support for multiple RF services is provided using an overlay architecture).

In the embodiment shown in FIG. 1A, each of the remote units 106 is coupled to at least one remote antenna 110. For example, in some implementations, the remote antenna 110 is external to the remote unit 106. In this embodiment, the remote antenna 110 and the remote unit 106 are communicatively coupled via suitable link (for example, a coaxial or other cable). In other implementations, the remote antenna 110 is integrated into the remote unit 106. In some other implementations, the remote unit 106 includes at least one integrated remote antenna and includes an appropriate interface to communicatively couple the remote unit 106 to an external remote antenna.

Each of the remote units 106 is communicatively coupled to the host unit 102 via a suitable communication link 112. The communication links 112 can be implemented using wired communication links (for example, optical fiber, twisted-pair cabling, CATV cabling, or coaxial cabling) or wireless communication links (for example, microwave or WIMAX communication links or using "F1/F2" type frequency translation techniques). In some embodiments, each of the remote units 106 is communicatively coupled to the host unit 102 via separate communication links 112 that are implemented using separate physical media (for example, using separate point-to-point links implemented using optical fiber, twisted-pair cabling, CATV cabling, or coaxial cabling). In some embodiments, the remote units 106 are communicatively coupled to the host unit 102 using, at least in part, shared communication links 112 (for example, a hybrid-fiber coax (HFC) infrastructure or a local or wide area network (such as an Internet Protocol (IP) network)). Also, in some embodiments, the remote units 106 are coupled to the host unit 102 via one or more intermediary devices (for example, one or more "expansion" units).

In some situations, it is necessary or desirable to mount the remote unit 106 within some structure 118 that is located at the remote location 108 (for example, due to zoning regulations or for security reasons). One example of such a structure 118 is a utility pole on which the remote antenna 110 is attached near the top for good RF performance. In such an example, the remote unit 106 is inserted within a confined space 116 that is formed within the utility pole. The structure 118 has an opening 120 through which access is provided to the confined space 116 formed in the structure 118. In other embodiments, the structure 118 includes other types of structures.

The wireless communication system 100 includes a shelf assembly 114 that is used for mounting a remote unit 106 within the confined space 116 formed within the structure 118. The shelf assembly 114 is used to mount the remote unit 106 to the structure 118 within the confined space 116 while enabling the remote unit 106 to be slid in and out of the confined space 116 through the opening 120. This is done to make it easer to install and service the remote unit 106 by obviating the need for a service person to reach into the confined space 116 to install or service the remote unit 106. Instead, the remote unit 106 (or the attachment interface for the remote unit 106) can be slid out of the confined space 116 for easier access. At least one structure attachment interface 117 fixedly attaches the shelf assembly 114 to the structure 118. In one implementation of this embodiment, the structure attachment interface 117 is part of the shelf assembly 114 or is attached to the shelf assembly 114. In another implementation of this embodiment, the structure attachment interface 117 is part of the structure 118 or is attached to the structure 118. In yet another implementation of this embodiment, the structure 118 and the shelf assembly 114 each includes portions of the attachment interface 117. The at least one structure attachment interface 117 attaches a fixed portion of the shelf assembly 114 to a point represented generally at 111 within the confined space 116 of the structure 118.

In the particular embodiment shown in FIG. 1A, the structure 118 also includes a door (not shown in FIG. 1A) that covers the opening 120 when the door is closed. The door is attached to the structure 118 using suitable fasteners (for example, hinges) and includes suitable components to seal or otherwise protect the confined space 116 formed within the structure 118 (from, for example, weather).

Figure 1B:
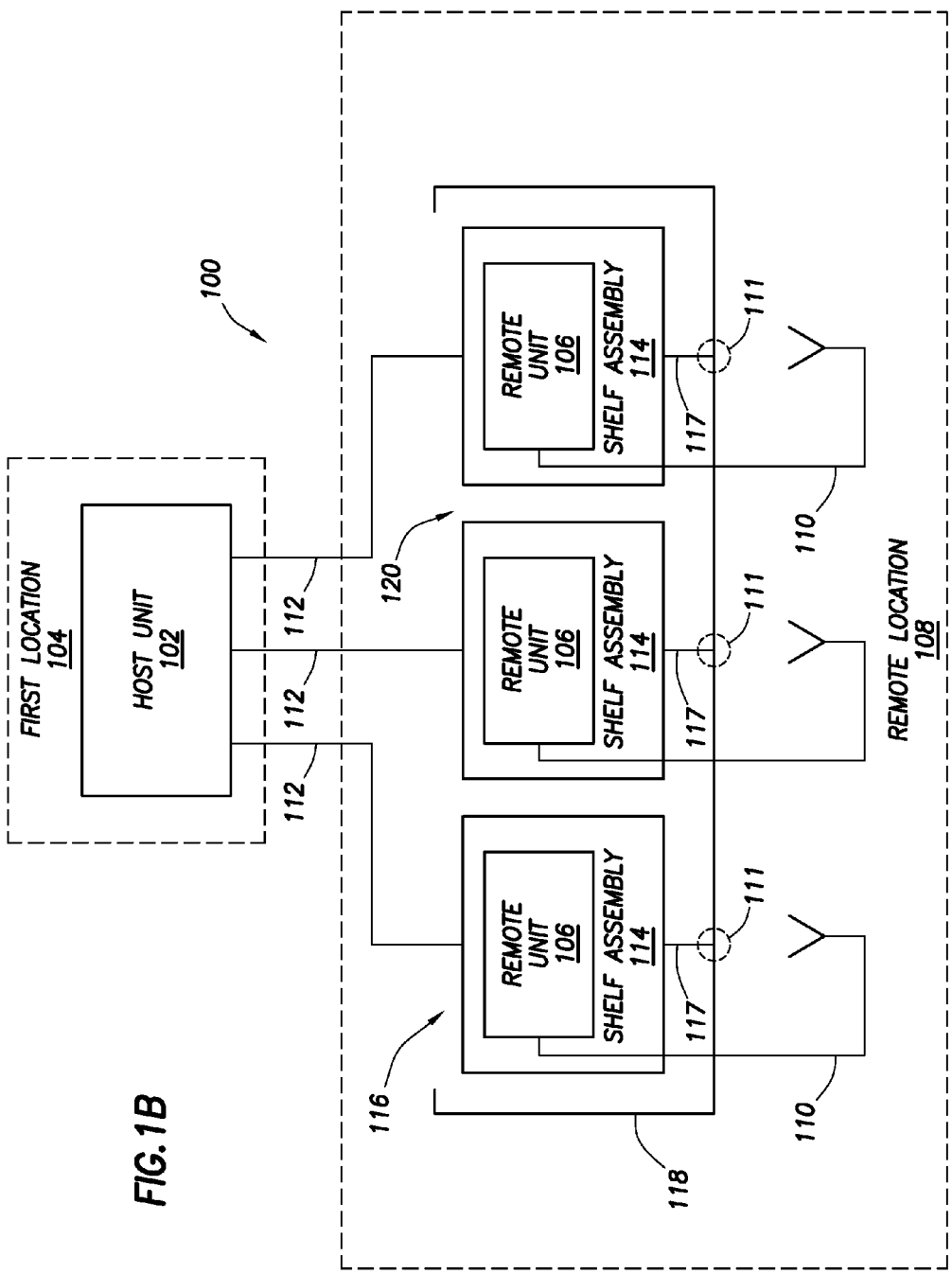
FIG. 1B is a block diagram of an alternative embodiment of a wireless communication system.

FIG. 1B is a block diagram of an alternative embodiment of a wireless communication system 100. The embodiment shown in FIG. 1B is substantially similar to the one shown in FIG. 1A except that multiple remote units 106 are housed within a single structure 118. In this embodiment, the structure 118 includes a cabinet. In this way, multiple remote units 106 can be deployed in a compact configuration but still can be easily installed and serviced by sliding the units out of the cabinet. Each one of the remote units 106 can slide out of the cabinet 118 while the others of the remote units 106 remain inside the cabinet 118. Alternatively, two of the remote units 106 can slide out of the cabinet 118 while the third remote unit 106 remains inside the cabinet 118.

Figure 2A:
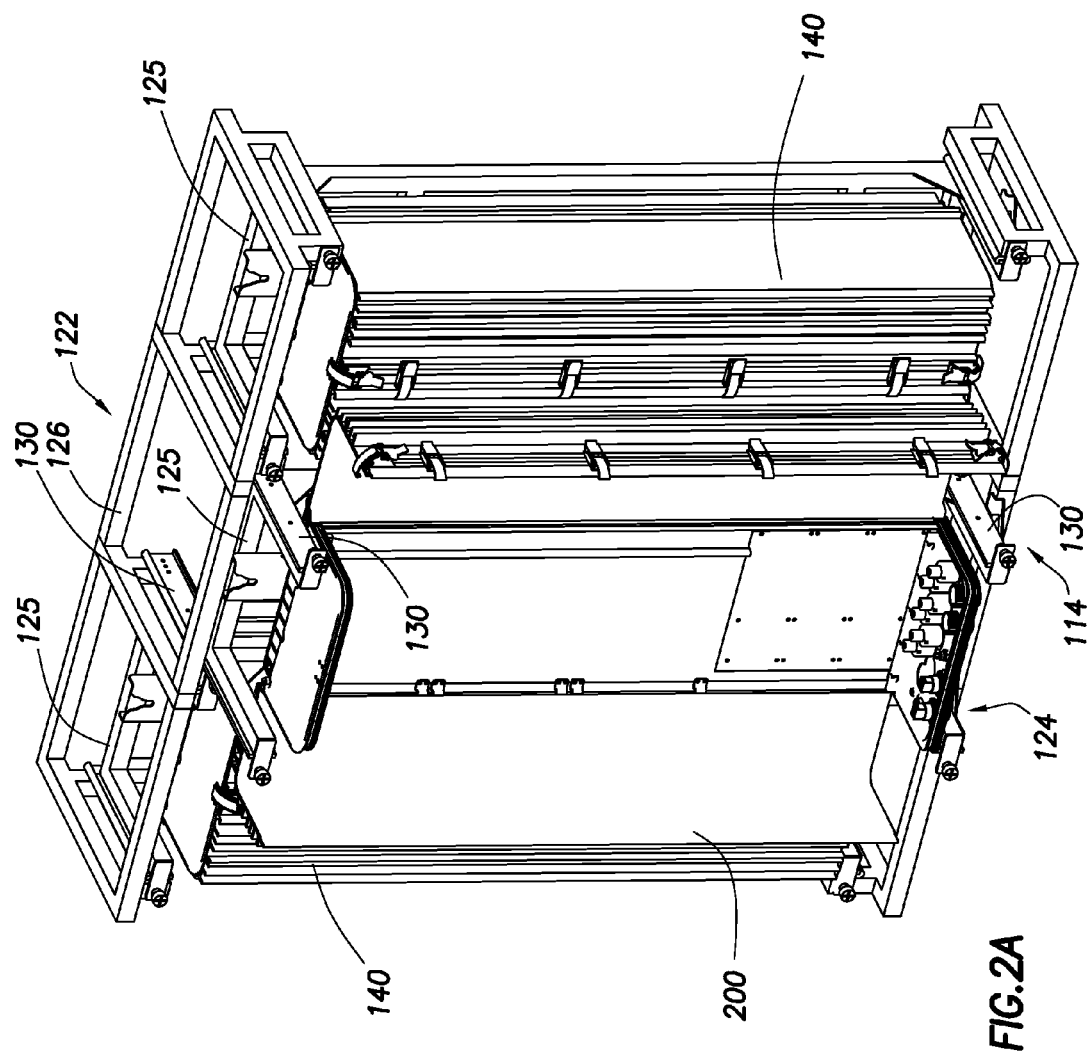
Figure 2B:
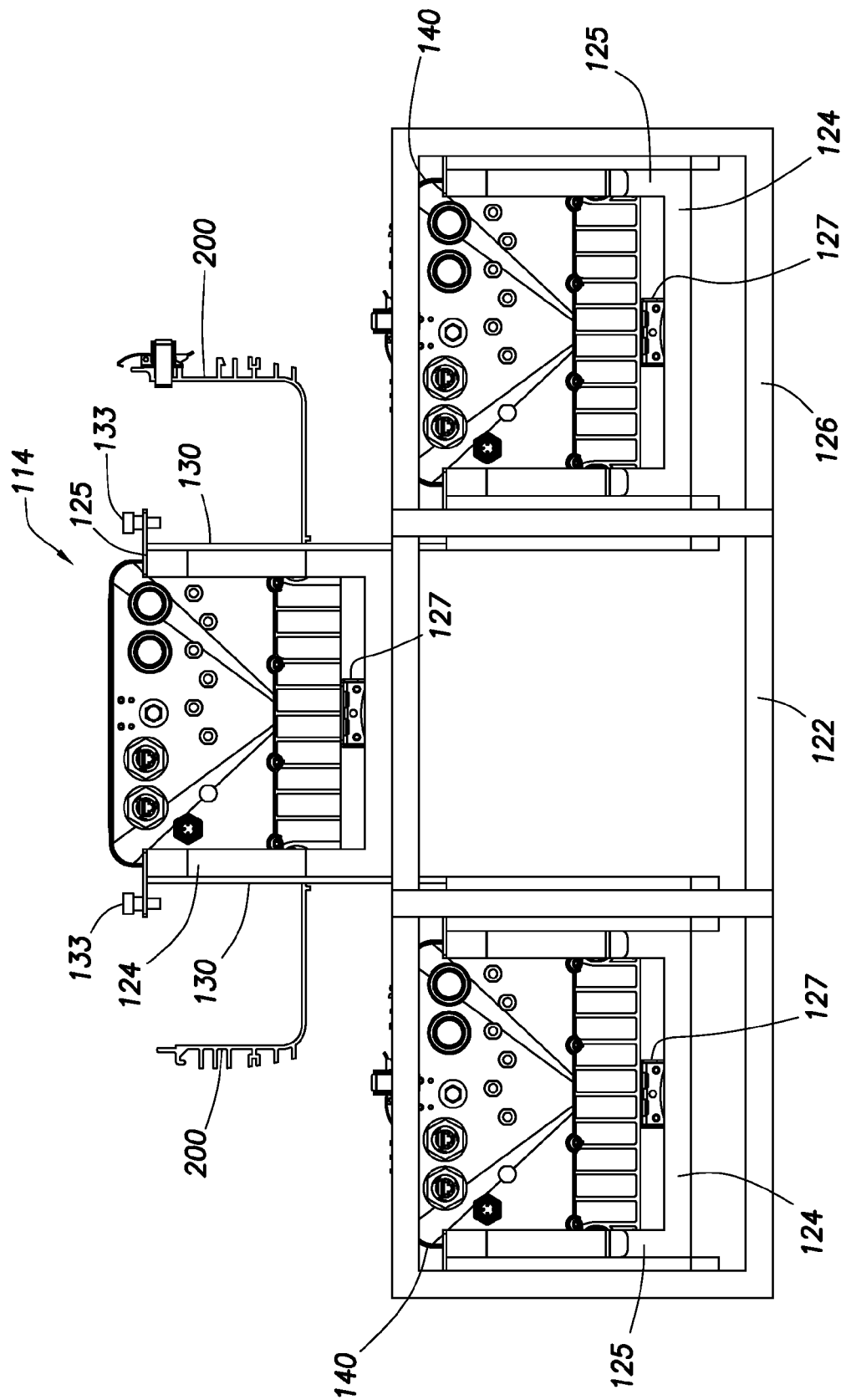

FIGS. 2A-2E are diagrams showing one exemplary embodiment of the shelf assembly 114 suitable for use in the system 100 of FIG. 1B. In general, the shelf assembly 114 includes a fixed portion 122 and a slideable portion 124. In the particular embodiment shown in FIGS. 2A-2E, the fixed portion 122 includes a frame 126 and the slideable portion 124 includes upper and lower U-shaped members 125 and a vertical member 127 (FIGS. 2B, 2C, and 2E). In one implementation of this embodiment, the slideable portion 124 includes a plurality of parts such as a horizontal part (for example the upper and lower U-shaped members 125), a vertical part (for example the vertical member 127) and other connecting parts that interface the horizontal part to the vertical part. The latch mechanism 133 holds the slideable portion 124 in the first (closed) state. All the enclosures 140 are in the closed state in FIGS. 2D-2E.

The shelf assembly 114 also includes two pairs of slides 130 (for example, friction or bearing slides). The slides 130 are used to mount the upper and lower U-shaped members 125 to the frame 126 in a manner that enables the slideable portion 124 to slide in and out of the frame 126. Each of the slides 130 is mounted on opposing lateral sides of a respective one of the upper and lower U-shaped members 125.

The fixed portion 122 of the shelf assembly 114 has a structure attachment interface 117 (FIG. 1B) that is used to fixedly attach the shelf assembly 114 to the structure 118. The fixed portion 122 of the shelf assembly 114 is attached to a part of the structure 118 that defines the confined space 116 within the structure 118. The structure attachment interface 117 is the particular mechanism that is used for such attachment. The fixed portion 122 of the shelf assembly 114 remains fixed (that is, does not slide) while the slideable portion 124 of the shelf assembly 114 is slid in and out. The particular structure attachment interface 117 that is used depends on the structure 118 to which the shelf assembly 114 is to be attached. For example, in the particular embodiment shown in FIGS. 2A-2E, the structure attachment interface 117 is used to attach the frame 126 to an interior wall surface of the cabinet. In this example, the structure attachment interface 117 includes one or more mounting brackets or holes that are used to attach the exterior cabinet enclosure to the frame 126 (for example, using nuts and bolts or other fasteners). In other implementations, other types of fasteners or mounting structures are used to implement the structure attachment interface 117.

The slideable portion 124 of the shelf assembly 114 is operable to slide out and extend from the fixed portion 122 of the shelf assembly 114. The shelf assembly 114 is mounted within the confined space 116 (FIGS. 1A and 1B) so that (at least) a portion of the slideable portion 124 is able to slide out through the opening 120 (FIGS. 1A and 1B) formed in the structure 118.

A remote unit in an electronics enclosure 140 can be attached to the slideable portion 124 of the shelf assembly 114. In that case, when the doors 200 in the electronics enclosure 140 are opened, the components that include the remote unit are exposed. In one implementation of this embodiment, the structure attachment interface 117 is a remote unit attachment interface.

Figure 3E:
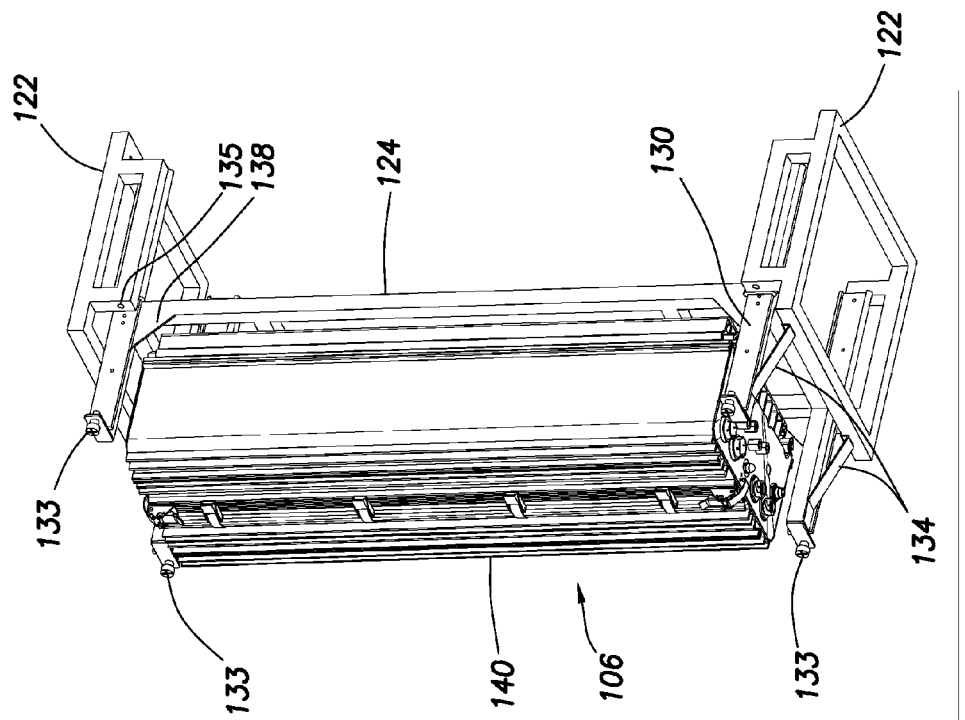
Figure 3D:
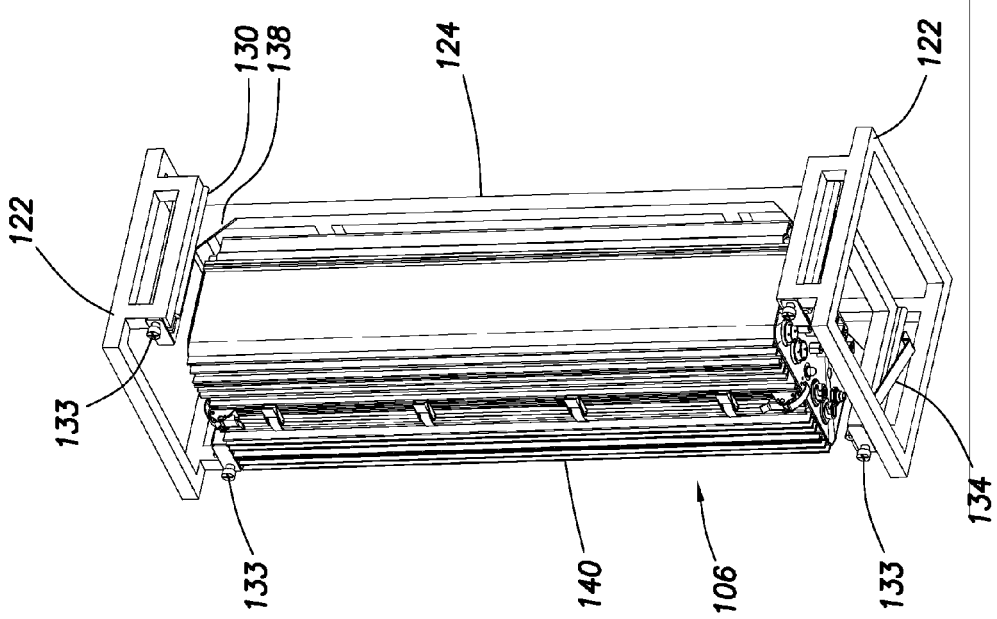

FIGS. 3A-3E are diagrams showing an alternative embodiment of a shelf assembly 114 suitable for use in the system 100 of FIG. 1A. FIGS. 3A and 3B are oblique views of the shelf assembly 114 attached to the back side 146 of an electronics enclosure 140 that houses a remote unit 106 (or other electronic device) that is not visible when the enclosure 140 is in the closed position. FIG. 3C is an enlarged view of a shoulder bolt 107 on the back surface 146 of the electronics enclosure 140 positioned to slide into the enclosure attachment interface 136. FIGS. 3D and 3E are oblique views of the front side of an electronics enclosure 140 housing a remote unit 106 (or other electronic device) attached to the shelf assembly 114. In one implementation of this embodiment, the remote unit 106 (or other electronic device) is not is an enclosure, but is directly attached to the shelf assembly 114.

The slideable portion 124 has a plurality of enclosure attachment interfaces 136 formed therein or attached thereto. As shown in FIGS. 3A-3C, the plurality of enclosure attachment interfaces 136 are slots in the vertical member 127 of the slideable portion 124. The enclosure attachment interfaces 136 are used to attach the remote unit 106 (or other electronic device) in an electronics enclosure 140 to the slideable portion 124 of the shelf assembly 114. The back surface 146 of the electronics enclosure 140 housing the remote unit 106 includes shoulder bolts 107 that pass through and slide into the slots that form the enclosure attachment interface 136. Thus, in this embodiment, the enclosure attachment interface 136 includes a mounting bracket (e.g., vertical member 127) designed to mate with a corresponding mounting structure (e.g., shoulder bolts 107) on the electronics enclosure 140 housing the remote unit 106. The mounting bracket and the corresponding mounting structure are designed to be screwed together using nuts and bolts or other fasteners. In one implementation of this embodiment, the electronics enclosure 140 is attached to the enclosure attachment interface 136 by dropping the electronics enclosure 140 onto the electronics attachment interface 136 from above. In another implementation of this embodiment, enclosure attachment interfaces 136 are part of the remote unit 106. Other enclosure attachment interfaces 136 can be used with other configurations of remote unit 106 and electronics enclosure 140. In other implementations, other types of fasteners or mounting structures are used to implement the enclosure attachment interface 136.

The slideable portion 124 of the shelf assembly 114 is configured to have a first state in which the slideable portion 124 is held in a first position. In the first position, also referred to herein as the "first state" or "closed state," the entire slideable portion 124 of the shelf assembly 114 is positioned within the fixed portion 122 of the shelf assembly 114. This first state is shown in FIGS. 3B and 3D. The slideable portion 124 of the shelf assembly 114 is also configured to have a second state in which the slideable portion 124 is held in a second position. In the second position, also referred to herein as the "second state," or "extended state," the entire slideable portion 124 of the shelf assembly 114 is positioned outside of the fixed portion 122 of the shelf assembly 114. This second state is shown in FIGS. 3A and 3E. The slideable portion 124 is configured to have at least the enclosure attachment interface 136 positioned outside of the structure 118 when the slideable portion 124 is in the second state.

A stabilization structure 138 stabilizes the electronics enclosure 140 that houses the remote unit 106 when the slideable portion 124 is in the second state. As shown in FIGS. 3A, 3B, 3D, and 3E, the stabilization structure 138 is attached to the slideable portion 124 to provide lateral stability to the remote unit 106 (or electronics enclosure 140) when the slideable portion 124 is in the second (extended) state. In one implementation of this embodiment, the stabilization structure 138 is attached to the fixed portion 122. For example, the stabilization structure can be implemented using a pair of telescoping rails attached to the fixed portion 122. The stabilization structure stabilizes the electronics enclosure 140 but does not support the load of the remote unit 106 when the slideable portion 124 is in the second (extended) state.

Views of the latch mechanisms 133 and 134 are seen in FIGS. 3A, 3B, 3D, and 3E. In this particular embodiment, the slideable portion 124 includes a latch mechanism 133 (also referred to herein as a "first latch mechanism 133") to hold the slideable portion 124 in the first (closed) state (FIGS. 3B and 3D). The latch mechanism 133 includes a corresponding release mechanism (also referred to herein as a "release process") to release the slideable portion 124 and permit it to slide into the extended state. As shown in FIGS. 3B and 3D, the latch mechanism 133 for the closed state includes captive screws in the front surface of the upper and lower U-shaped members 125. When the slideable portion 124 is held in a closed state the captive screws are able to be screwed into respective screw holes 135 in the frame 126 of the fixed portion 122. In this case, the release process is an unscrewing of the captive screws to release the slideable portion 124 and permit it to slide into the extended state.

In the particular embodiment as shown in FIGS. 3A and 3E, the latch mechanism 134 (also referred to herein as a "second latch mechanism 134") holds the slideable portion 124 in the extended state so that the slideable portion 124 does not move when the remote unit 106 is installed on the slideable portion 124. Likewise, the latch mechanism 134 holds the slideable portion 124 in the extended state so that the slideable portion 124 does not move when a remote unit 106 previously installed on the slideable portion 124 is serviced. As shown in FIGS. 3A and 3E, the latch mechanism 134 for the extended state include spring arms (such as sheet metal spring arms) that slide up and over the fixed frame 122 as the slideable portion 124 slides into the extended state. The spring arms snap down over the fixed frame 122 when the slideable portion 124 in the extended state. Once the spring arms snap down over the fixed frame 122, the slideable portion 124 is held in the extended state.

The latch mechanism 134 includes a corresponding release mechanism or release process to release the slideable portion 124 and permit it to slide back into the closed state. In the illustrated embodiment of FIGS. 3A and 3E, the release process is an upward push on the spring arms to release the slideable portion 124 and permit it to slide into the closed state.

Figure 4C:
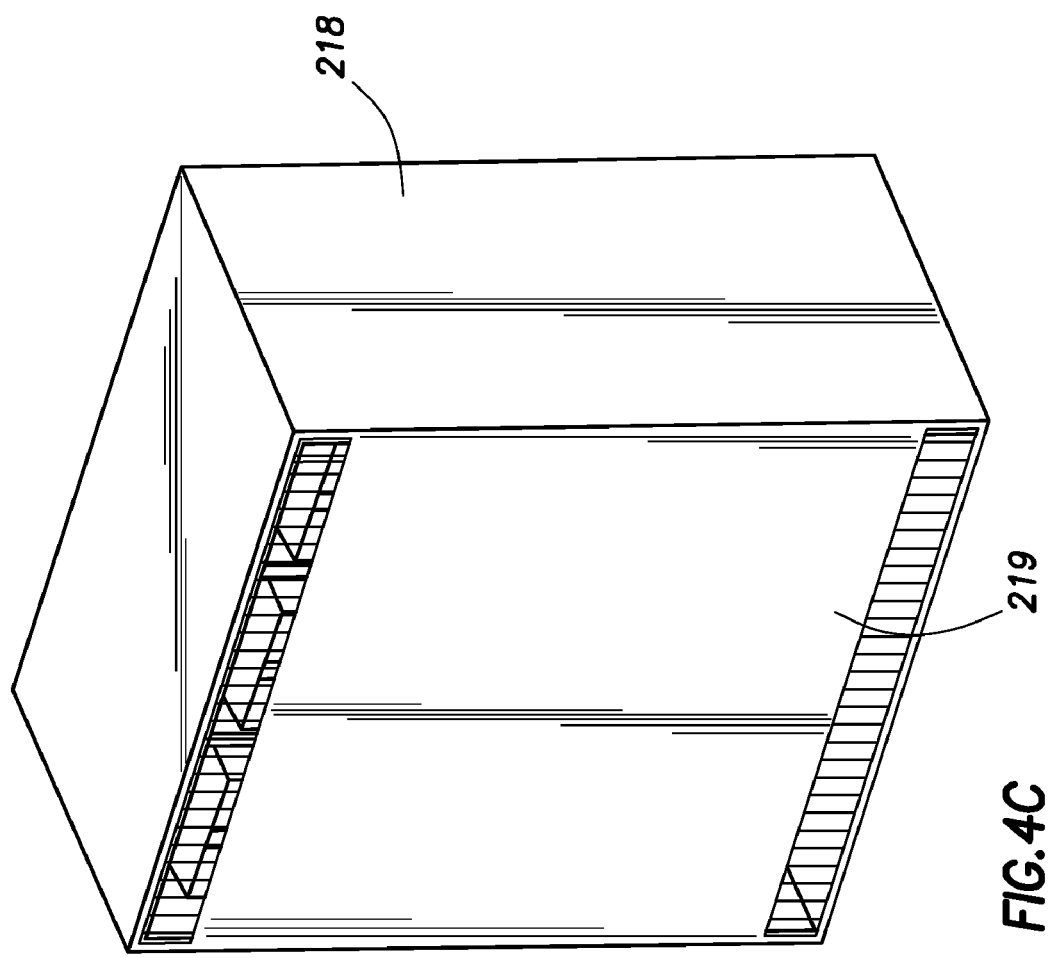

FIGS. 4A-4E are diagrams showing one embodiment of a shelf assembly in an enclosure of FIG. 1B. As shown in FIG. 4A, three remote units 106(1-3) are each attached to a respective slideable portion 124. The slideable portions 124 are each in the first state so that all the remote units 106(1-3) are positioned in the enclosure 218, also referred to herein as "cabinet 218." When the slideable portion 124 is in the first state and the shelf assembly 114 is positioned within a cabinet 218 (FIG. 1A), a door 219, also referred to herein as "cover 219," can be closed or attached to cover the opening 120 (as shown in FIGS. 4B-4C).

Figure 4D:
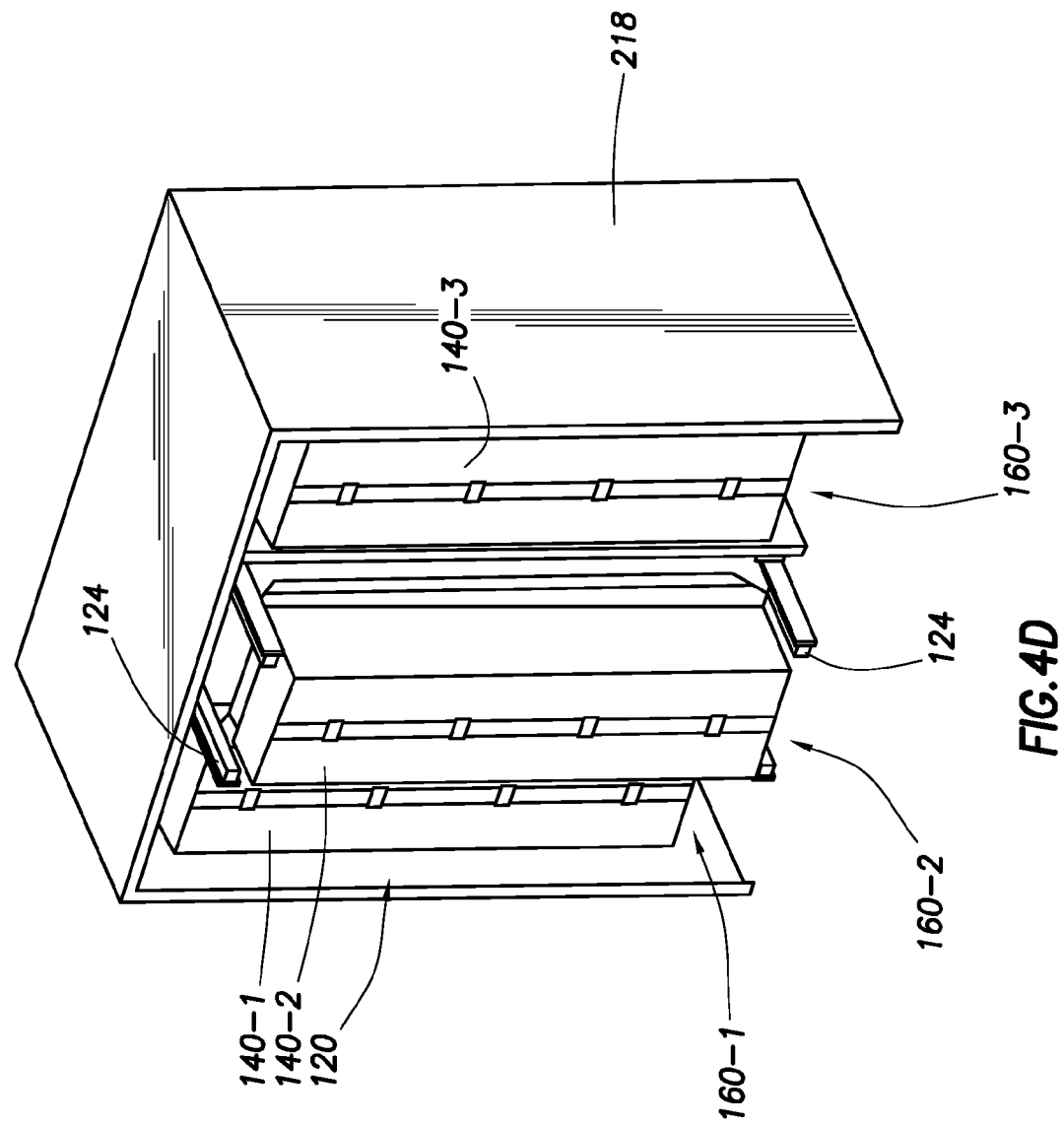
Figure 4E:
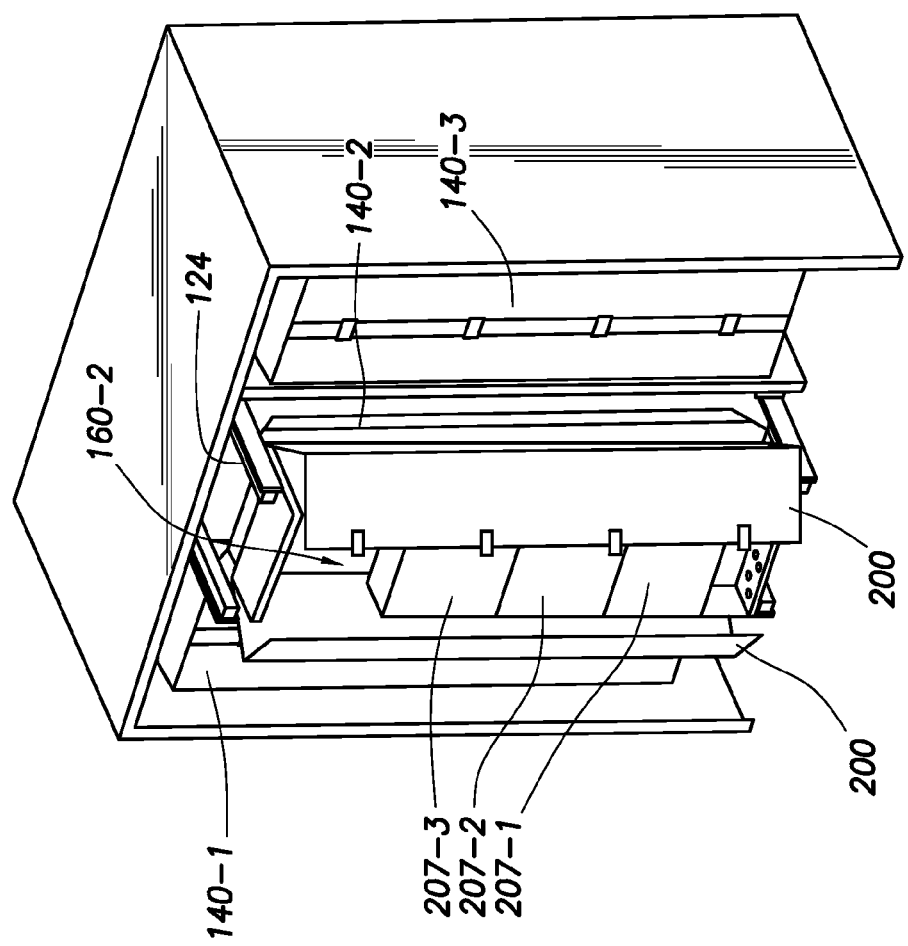

As shown in FIG. 4D, the door 219 is removed or opened and the slideable portion 124 of the shelf assembly 114 holding the remote unit 106-2 is slid through the opening 120 until the slideable portion 124 supporting the remote unit 106-2 reaches the second state. When the slideable portion 124 of the shelf assembly 114 is in the second state, the remote unit 106-2 can be serviced or removed from the enclosure attachment interface 136 (FIG. 3A-3C). For example, as shown in FIG. 4E, doors 200 of the electronic enclosure 140-2 that houses the remote unit 106-2 are opened to access and service components and modules 207(1-3) that are housed within the electronic enclosure 140-2.

Figure 5B:
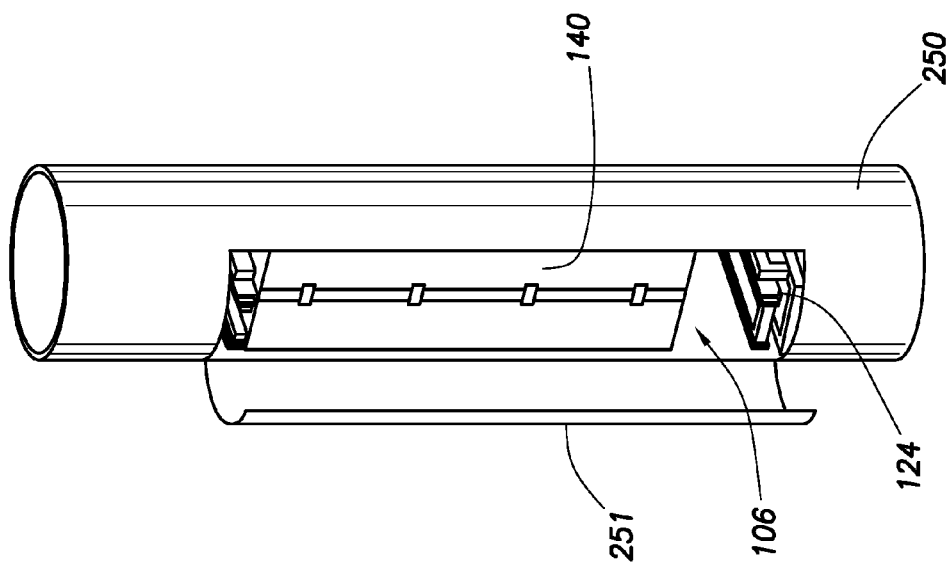
Figure 5A:
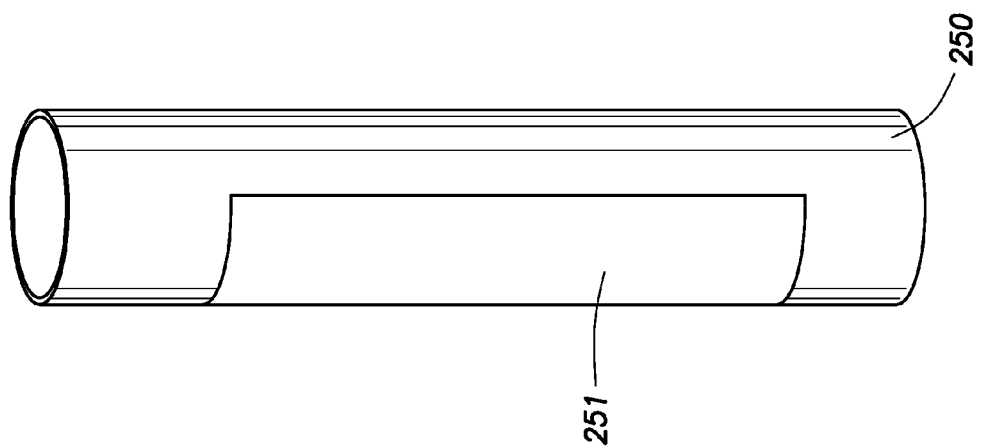

FIGS. 5A-5D are diagrams show one embodiment of a shelf assembly in an enclosure of FIG. 1A. The shelf assembly shown in FIGS. 5A-5D is similar to the one shown in FIGS. 3A-3E but has been adapted for use in a utility pole 250. In particular, only one remote unit 106 is housed within the utility pole 250. The fixed portion 122 of the shelf assembly 114 is adapted to fit in and attach to the utility pole 250. FIG. 5A shows the utility pole 250 with the door 251 closed. FIG. 5B shows the door 251 in an open position and the slideable portion 124 of the shelf assembly 114 (and the remote unit 106 attached thereto) in a closed state. FIG. 5C shows the door 251 in an open position with the slideable portion 124 of the shelf assembly extended out of the utility pole 250 in the extended state. FIG. 5D shows the door 251 in an open position with the slideable portion 124 of the shelf assembly 114 extended out of the utility pole 250. The doors 200 of the electronic enclosure 140-2 housing the remote unit 106-2 are opened to provide access to the components and modules 207(1-3) that are housed within the electronic enclosure 140-2 housing the remote unit 106-2.

Figure 6:
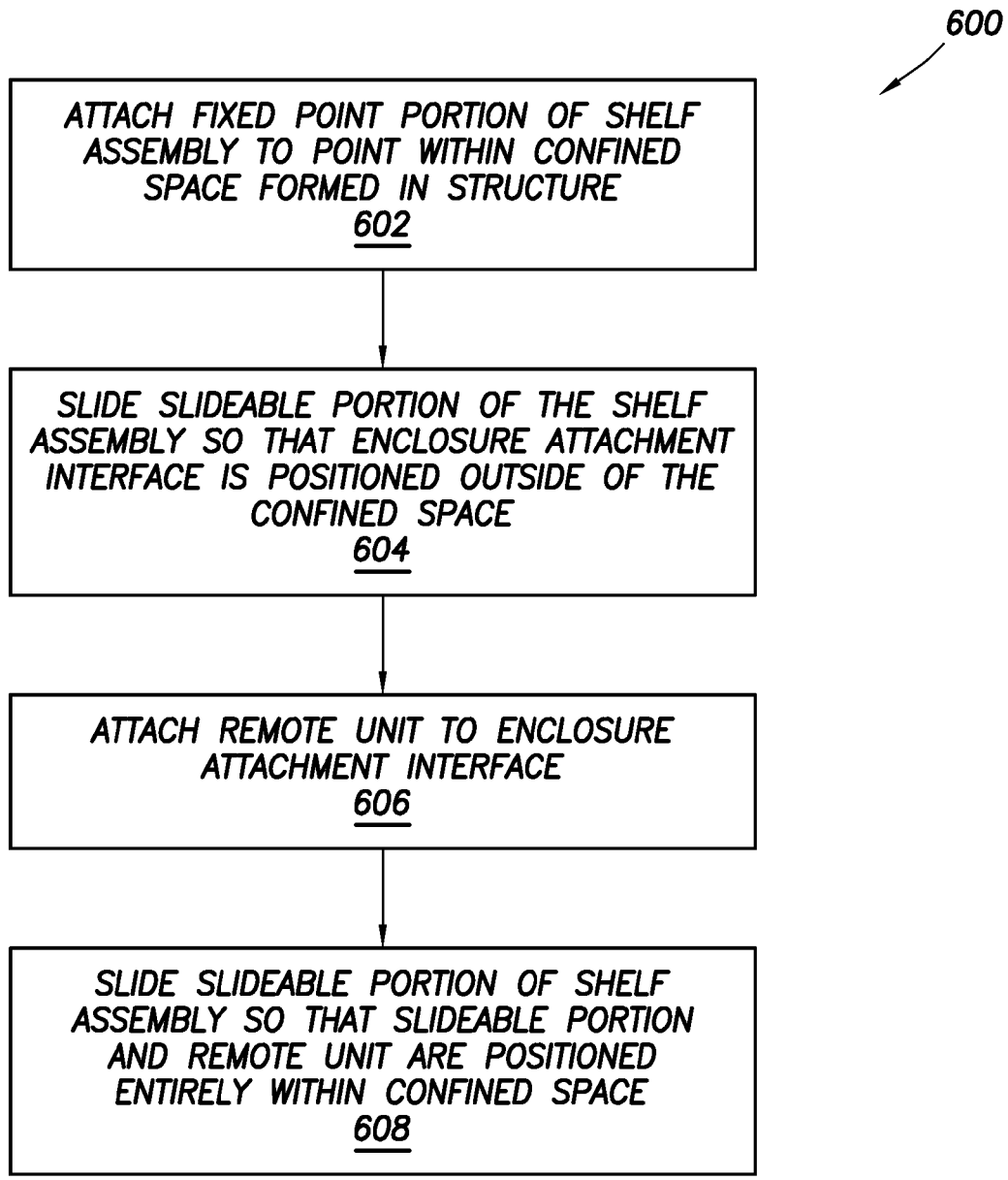
FIG. 6 is a flow diagram of one embodiment of a method of mounting an electronics enclosure within a confined space formed within a structure.

FIG. 6 is a flow diagram of one embodiment of a method 600 of mounting an electronics enclosure within a confined space formed within a structure. The particular embodiment of method 600 shown in FIG. 6 is described here as being implemented using the system 100 and shelf assembly 114 of FIGS. 1A and 5A-D, though it is to be understood that other embodiments are implemented in other ways.

Method 600 includes attaching the fixed portion 124 of the shelf assembly 114 to a point within the confined space 116 of the structure 118 (block 602). For example, as described above in connection with FIGS. 5A-5D, where the fixed portion 124 is implemented using the frame 126, the frame 126 can be mounted to an interior wall surface of a confined space 116 that is formed within a utility pole 250.

Method 600 also includes sliding the slideable portion 124 of the shelf assembly 114 so that the enclosure attachment interface 136 is positioned outside of the confined space 116 (block 604) and then attaching the remote unit 106 (or other electronic device) in an electronics enclosure 140 to the enclosure attachment interface 136 (block 606). For example, as described above in connection with FIGS. 5A-5D, the door 251 that covers the opening 120 in the utility pole 250 is opened and the slideable portion 124 is slid through the opening 120 far enough to have the enclosure attachment interface 136 positioned outside of the utility pole 250. The slideable portion 124 is slid until it reaches the second position, where the latch mechanism 134 (FIGS. 3A-3C) holds the slideable portion 124 in the second state. When the enclosure attachment interface 136 is positioned and held in the second (extended) state, the remote unit 106 can be attached to the enclosure attachment interface 136 of the slideable portion 124 without requiring a service person to reach into the confined space 116 defined within the utility pole 250. In one implementation of this embodiment, attaching the electronics enclosure 140 to the attachment interface 136 includes dropping the electronics enclosure 140 onto the electronics attachment interface 136 from above. For example, a shoulder bolt 107 on the back surface 146 of the electronics enclosure 140 is lowered onto the electronics attachment interface 136 from above (for example, using a crane) and then attached to the slideable portion 124 using the electronics attachment interface 136.

Method 600 also includes sliding the slideable portion 124 of the shelf assembly 114 so that the slideable portion 124 and the electronics enclosure 140 are positioned entirely within the confined space 116 (block 608). In the particular embodiment described above in connection with FIGS. 5A-5D, the slideable portion 124 is slid into the confined space 116 defined in the utility pole 250 until it reaches the first position, where the latch mechanism 133 (FIGS. 3B and 3D) holds the slideable portion 124 in the closed state. When the slideable portion 124 is positioned and held in the first position, the door can be closed in order to cover the opening 120. As result, the remote unit 106 housed in the electronics enclosure 140 will be enclosed within the utility pole 250 and will generally not be visible.

Thereafter, if the remote unit 106 needs to be serviced or removed, the door 251 can be opened and the slideable portion 124 slid out of the opening 120 into the extended state. While the slideable portion 124 is held in the extended state by the latch mechanism 134, the remote unit 106 can be serviced or removed without requiring a service person to reach in to the confined space 116 formed in the utility pole 250.

Although particular embodiments of the shelf assembly 114 have been described above, it is to be understood that the shelf assembly can be implemented in other ways. For example, in some alternative embodiments, the slideable portion of the shelf assembly includes a two-part, nesting shelf, which is attached to the fixed portion using telescoping slides. The use of a two-part, nesting shelf and telescoping slides enables the shelf to extend out a longer distance than would be the case if the shelf was made from a single member or if the slides did not telescope (though it is to be understood that in some other embodiments such a shelf or slide are used).

The wireless communication system 100 can be implemented in various ways. In some embodiments, the wireless communication system 100 includes an outdoor distributed antenna system (DAS). In such embodiments, the host unit 102 is located at a first location (for example, a location from where it is convenient to communicate with the one or more base stations with which that host unit 102 communicates). In some such embodiments, the host unit 102 is directly connected to the one or more base stations with which it communicates (for example, via coaxial cabling). In some other embodiments, the host unit 102 communicates with the one or more base stations via a wireless communication link (for example, where the host unit 102 is coupled to a donor antenna via a bi-directional amplifier, which are used to amplify signals that are radiated and received using the donor antenna). In such embodiments, the remote units 106 are located so as to provide the desired coverage. Downlink RF signals are received from the base station at the host unit 102, which the host unit 102 uses to generate one or more downlink transport signals for transmitting to one or more of the remote units 106. Each such remote unit 106 receives at least one downlink transport and reconstructs the downlink RF signals from the downlink transport signal and causes the reconstructed downlink RF signals to be radiated from the remote antenna 110 coupled to or included in that remote unit 106. A similar process is performed in the uplink direction. Uplink RF signals received at one or more remote units 106 are used to generate respective uplink transport signals that are transmitted from the respective remote units 106 to the host unit 102. The host unit 102 receives and combines the uplink transport signals transmitted from the remote unit 106. The host unit 102 reconstructs the uplink RF signals received at the remote units 102 and communicates the reconstructed uplink RF signals to the base station. In this way, the coverage of the base station can be expanded.

In some such embodiments, the system 100 includes a digital DAS in which the downlink and uplink transport signals are generated by digitizing the downlink and uplink RF signals, respectively. In other such embodiments, the system 100 includes an analog DAS in which the downlink and uplink transport signals are generated by amplitude modulating an optical carrier signal with the RF signals. In other embodiments, the RF signals are transported between the host unit 102 and the remote units 106 in other ways.

In such outdoor DAS embodiments, the shelf assembly 114 described above can be used to mount a remote unit 106 in an outdoor structure such as a utility pole 250. In such an application, the fixed portion 122 of the shelf assembly 114 is mounted to the interior of the utility pole 250 via a structure attachment 117 (for example, using suitable mounting brackets that are attached to an interior wall surface of the utility pole 250). The slideable portion 124 of the shelf assembly 114 slides in and out of the confined space 116 defined in the utility pole 250 through an opening 120 formed in the utility pole 250. In such an application, the shelf assembly 114 is mounted and positioned in the confined space 116 formed within the utility pole 250 so that the entire slideable portion 124 of the shelf assembly 114 can be slid into the confined space 116 formed in the utility pole 250 and positioned within the utility pole 250 and locked into that position. Also, when the shelf assembly 114 is in this first state, a door 251 can be closed to cover the opening formed in the utility pole 250. The shelf assembly 114 is also mounted and position in the confined space 116 formed within the utility pole 250 so that at least the enclosure attachment interface 128 of the slideable portion 124 can be slide out of the confined space 116 through the opening and locked. When the slideable portion 124 of the shelf assembly 114 is in this second locked state, the remote unit 106 can be attached to the enclosure attachment interface 128 or the remote unit 106 can be serviced.

In some embodiments, the wireless communication system 100 includes an indoor distributed antenna system (DAS). Such a system is similar to an outdoor DAS except that the remote units 106 are positioned within a building in order to provide coverage within the building. In such an embodiment, the shelf assembly 114 can be used to mount remote units 106 within structures 118 such as walls.

In some embodiments, the wireless communication system 100 includes a distributed base station in which the host unit 102 includes base station baseband signal processing functionality and base station control functionality and the remote units 102 include remote radio heads. The remote radio heads include RF transceivers and power amplifiers. The digital baseband data is transported between the baseband processing located in the host unit 102 and the remotely located RF transceivers located at the remote units 106. In some such embodiments, the host unit 102 is communicatively coupled to the remote units 102 using, for example, point-to-point optical fiber links or a wide or local area network (for example, an IP network). In some such embodiments, the host units and remote radio heads are configured to support specifications published by at least one of the Common Public Radio Interface (CPRI) consortium and the Open Base Station Architecture Initiative (OBSAI) consortium.

In some embodiments, at least some of the remote units 106 include at least a portion of a base station and the host unit 102 includes at least one of a base station controller, a portion of a base station controller, and at least one base station. For example, in some such embodiments, at least one remote unit 106 includes a pico or femto base station and the host unit 102 includes a base controller that is designed to manage the pico or femto base station. In such embodiments, the remote unit 106 is communicatively coupled to the host unit 102 using a wide or local area network (such as an IP network).

In some embodiments, the wireless communication system 100 is used in "base station hotel" configuration in which multiple wireless service providers share a single wireless communication system 100. Indeed, base stations hotels are often used in environments where it is desirable to minimize the visual impact of any telecommunications equipment that is deployed in such environments. As a result, the shelf assembly 114 may be especially useful in such environments.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A wireless communication system comprising:
a first unit located at a first location;
at least one remote unit communicatively coupled to the first unit, wherein the at least one remote unit is located at a second location that is remote from the first location; and
a shelf assembly to mount the remote unit within a confined space formed within a structure at the second location;
wherein the shelf assembly comprises:
a fixed portion having a structure attachment interface to fixedly attach the shelf assembly to the structure; and
a slideable portion that is operable to slide out and extend from the fixed portion of the shelf assembly, the slideable portion having a remote unit attachment interface to attach the remote unit to the slideable portion of the shelf assembly; and
wherein the slideable portion is configured to have a first state in which the slideable portion is held in a first position, wherein the slideable portion is configured to have the entire slideable portion of the shelf assembly positioned within the structure when the slideable portion is in the first state; and
wherein the slideable portion is configured to have a second state in which the slideable portion is held in a second position, wherein the slideable portion is configured to have at least the remote unit attachment interface positioned outside of the structure when the slideable portion is in the second state.

2. The wireless communication system of claim 1, wherein the first unit and remote unit are a part of at least one of an outdoor distributed antenna system, and an indoor distributed antenna system.

3. The wireless communication system of claim 1, wherein the remote unit comprises at least a portion of a base station transceiver and the first unit comprises at least one of at least a portion of a base station controller, and at least one of a base station.

4. The wireless communication system of claim 3, wherein the remote unit comprises at least one of a pico basestation and a femto base station.

5. The wireless communication system of claim 3, wherein the remote unit comprises a remote radio head and the first unit comprises base station baseband signal processing functionality and base station control functionality.

6. The wireless communication system of claim 1, wherein the first unit and remote unit are communicatively coupled to one another using at least one of an optical fiber, twisted-pair cabling, CATV cabling, and coaxial cabling.

7. The wireless communication system of claim 1, wherein the first unit and remote unit are communicatively coupled to one another using an internet protocol (IP) communication link.

8. The wireless communication system of claim 1, wherein the slideable portion comprises a plurality of parts.

9. The wireless communication system of claim 1, wherein the slideable portion has a plurality of remote unit attachment interfaces to attach the remote unit to the slideable portion of the shelf assembly.

10. The wireless communication system of claim 1, wherein the remote unit attachment interface comprises at least one mounting bracket.

11. The wireless communication system of claim 1, wherein the shelf assembly comprises a plurality of remote unit attachment interfaces to fixedly attach the shelf assembly to the structure.

12. The wireless communication system of claim 1, further comprising a stabilization structure to stabilize the remote unit when the slideable portion is in the second state.

* * * * *